United States Patent
Reilly et al.

(10) Patent No.: US 6,522,747 B1
(45) Date of Patent: Feb. 18, 2003

(54) SINGLE-SIDED SUBBAND FILTERS

(75) Inventors: James Reilly, Hamilton (CA); Nima Ahmadvad, Ottawa (CA); Mike Seibert, Oakville (CA); Gordon Reesor, Russell (CA)

(73) Assignee: Zarlink Semiconductor Inc., Ottawa (CA)

( * ) Notice: Subject to any disclaimer, the term of this patent is extended or adjusted under 35 U.S.C. 154(b) by 0 days.

(21) Appl. No.: 09/447,586

(22) Filed: Nov. 23, 1999

(30) Foreign Application Priority Data

Nov. 23, 1998 (GD) ............................................. 9825576

(51) Int. Cl.$^7$ ............................................. H04M 1/00
(52) U.S. Cl. .............................. 379/406.14; 379/406.01
(58) Field of Search ...................... 379/406.14, 406.01, 379/406.11; 704/205, 500, 501, 503, 504

(56) References Cited

U.S. PATENT DOCUMENTS

| | | | |
|---|---|---|---|
| 4,766,562 A | 8/1988 | Vary | 364/724 |
| 4,896,320 A | 1/1990 | Gockler | 370/123 |
| 5,136,577 A | * 8/1992 | Amano et al. | 370/289 |
| 5,272,695 A | * 12/1993 | Makino et al. | 370/291 |
| 5,818,945 A | * 10/1998 | Makino et al. | 370/291 |

FOREIGN PATENT DOCUMENTS

| | | |
|---|---|---|
| EP | 0443547 | 8/1991 |
| EP | 0758830 | 2/1997 |
| GB | 2240452 | 7/1997 |
| GB | 2314749 | 1/1998 |
| WO | 91/08616 | 6/1991 |

OTHER PUBLICATIONS

Proc. Of 1$^{st}$ Int. Symp. On Communications Systems & Digital Signal Processing, ed. Z. Ghassemlooy et al, 1998, IEEE, pp. 32–35 vol. 1, Weiss et al "Efficient implementations of complex and real valued filter banks for comparative subband processing with an application to adaptive filtering".

* cited by examiner

*Primary Examiner*—Forester W. Isen
*Assistant Examiner*—Elizabeth McChesney
(74) *Attorney, Agent, or Firm*—Marks & Clerk

(57) ABSTRACT

In a method of processing an input signal, the input signal is divided into a plurality of subbands with the aid of bank of complex valued, single-sided subband filters. The single-sided frequency spectra of the resulting subbands make aliasing negligible at near twice the critical downsampling rates.

14 Claims, 8 Drawing Sheets

Subbanded signal at just below critical sampling:

Complex AIR estimate superimposed on signal:

Resulting echo signal:

Real AIR estimate superimposed on signal:

Resulting echo signal:

SINGLE-SIDED SUBBAND FILTERS

BACKGROUND OF THE INVENTION

This invention relates to the field of digital signal processing, and more particularly to the use of filter banks for solving signal processing problems.

Subbanding is a powerful signal processing tool which can be used to help solve a wide variety of problems. The basic idea behind subbanding is to split a signal into frequency bands by means of filter banks. The processing of the signal is done within each subband. There are many different ways to design the filter banks, so many different signal decompositions are possible. Subbanding can provide new or improved signal processing techniques which can make difficult problems more tractable.

There are a number of difficult signal processing problems for which subbanding could help generate improved solutions. Some of these include blind deconvolution, echo cancellation, blind signal separation, and double-talk detection. The key to an effective implemention of subbanding is to find a filter bank which decomposes the signals in such a way that it makes the problem easier to solve. This is not a trivial task. Filter bank design has been and continues to be, an active area of research.

Echo cancellation has been used extensively in telecommunications applications to recondition a wide variety of signals, such as speech, data transmission, and video. The search for mathematical algorithms to perform echo cancellation has produced several different approaches with varying degrees of complexity, cost, and performance.

In some applications, such as the cancellation of acoustic speech echoes in hands-free phones, the echo duration can be quite long. For typical rooms the echo can range from 100 ms to 500 ms. A traditional approach to echo cancellation uses an adaptive filter of length L, where L equals the number of samples necessary to extend to just beyond the duration of the echo. Even at a telephone bit rate of 8000 samples per second, the value of L can easily be in the thousands. The computational requirements of an adaptive filter is proportional to 2L for the popular LMS (Least Mean Squares) class of algorithms, and proportional to $L^2$ or higher for algorithms such as RLS (Recursive Mean Squares). More robust algorithms (like RLS) have greatly improved convergence characteristics over LMS methods, but the $L^2$ computational load makes them impractical with current technology. Convergence time also increases exponentially with the size of L for most algorithms. It is important to have fast convergence, especially in the case of acoustic echo cancellation, because the echo path may be continually changing as people and objects move within the environment. An echo canceller designed to deal with an echo length of several hundred milliseconds will have problems with either computational complexity or convergence speed and accuracy.

Due to the large length of the echoes encountered in most acoustic applications, it is nearly impossible to use a single adaptive filter to perform acoustic echo cancellation. Consequently, the use of subbanding has been proposed. An adaptive filter is used to cancel the echo within each subband, and the echo-free signal is then reassembled with a synthesis filter bank. Subbanding can reduce computational complexity and result in faster, more accurate convergence. However, the application of subbanding to echo cancellation has been done with limited success because of practical difficulties, such as aliasing errors associated with the downsampling process.

When the signals are divided into M subbands, M adaptive filters are required to perform the echo cancellation. Within each subband, the signals are downsampled, that is, the sample rate is reduced. The factor by which the sample rate is reduced is typically referred to as the downsampling rate. For example, a downsampling rate of four implies that the sample rate has been reduced by a factor of four within each subband. It is important to distinguish between the downsampling rate and the sample rate. An increase in the downsampling rate results in the decrease in the sample rate.

A special case occurs when the downsampling rate equals the number of subbands (M). This is known as critical sampling, and the corresponding downsampling; rate is called the critical sampling rate. Critical sampling represents the highest amount of downsampling that is possible before signal information is lost. In this specification, reference will be made to a downsampling rate of twice the critical sampling rate. This indicates a downsampling rate equal to twice the number of subbands (2M), and a corresponding sample rate that is half as fast as critical sampling.

The length of each adaptive filter is reduced by a factor equal to the downsampling rate. The reduced sample rate allows for more time to perform computations between samples, and the shorter adaptive filters will converge with fewer iterations, and to a more accurate result. There is additional overhead from the subband filters, but there are efficient algorithms to do the subbanding. The subband filters will also introduce additional delay into the system. Provided that the subband filters are kept reasonably short, this computational overhead and additional delay will be tolerable.

With many signal processing problems, difficulties arise because existing techniques tend to provide inaccurate solutions, or they require too many computations to be economically implemented with current technology. For example, a fullband echo canceller which uses just one adaptive filter is simply not practical for the echoes typically encountered in real acoustic environments. LMS-based methods are computationally attractive, but give echo estimates which are prone to error. More accurate algorithms, like RLS, require too many computations for economical implementation. The use of subbanding allows much more accurate echo estimates to be generated for long echoes using LMS, and the computational load is reasonable. However, subbanding introduces new implementation difficulties.

There are two basic ways to perform subbanding. The direct approach involves using an M-channel filter bank to split the signal into M subbands. There are a number of problems with this method. Since ideal square filters cannot be used, there will be overlap between the subbands. This leads to aliasing errors, which become worse as the downsampling rate approaches the critical sampling rate. Lowering the downsampling rate (over-sampling) reduces aliasing, but can lead to over-determination of the problem and poor convergence. The subband filters can also introduce distortion. Filter bank theory shows that, with careful filter design, aliasing and distortion errors can be eliminated by exploiting relationships between the analysis and synthesis filters. However, these relationships are destroyed if the signals undergo processing between decomposition and reconstruction. Clearly, such processing will be necessary to cancel an echo, and so aliasing and distortion errors are inevitable.

A more recent subbanding method is wavelet decomposition. Wavelets usually exhibit orthogonality characteristics that automatically give them perfect reconstruction properties (no aliasing or distortion errors). But as with regular filter banks, these properties depend on relationships between the analysis and synthesis filters, and these relationships are destroyed by intermediate processing. Wavelet filter banks are also constructed in a tree shape, by cascading two-channel splitters and mergers. There are very fast algorithms which can implement this, but the number of subbands must therefore be a power of two. There is also less freedom when designing wavelet filter banks, since wavelet filters have to meet certain criteria that regular filter banks do not.

Distortion can be made negligible with careful filter design. But neither subbanding method can completely eliminate the overlap between subbands, so aliasing is the main problem which must be overcome. In echo cancellation, aliasing manifests itself in the form of crossband echo. Most of the echo within a particular subband comes from the subband itself. This is known as in-band echo. Because of aliasing, some echo also comes from the other subbands. This is the cross-band echo. Reducing the downsampling rate can decrease aliasing but this diminishes the benefits of downsampling, namely the shorter filter lengths and reduced bit rate. The other option is to use cross-filters, that is, additional adaptive filters designed to eliminate cross-band echo. This increases the number of computations that need to be performed. It is highly desirable to eliminate cross-filters, since such a reduction reduces computations and simplifies the adaptive filter topology.

SUMMARY OF THE INVENTION

According to the present invention there is provided a method of processing an input signal, wherein said input signal is divided into a plurality of subbands with the aid of a bank of complex valued, single-sided subband filters, and processing takes place within said subbands.

In accordance with the principles of the invention, a filter bank has been developed which uses single-sided, subband filters, for example FIR filters, with complex filter coefficients. The single-sided frequency spectrums of the resulting subbands make aliasing negligible at near critical downsampling rates for the real case and near twice critical downsampling rate for the complex case. The filter bank is generally applicable to signal processing problems which use subbanding.

The filter bank coefficients are preferably based on the optimal least-squares approximation of a "near-ideal" filter whose characteristics are determined by the number of subbands and the downsampling rate.

The invention can be applied to large signal processing problems, which can be decimated using the complex subbanding approach. A particular application of the invention is to the field of echo cancelling.

An acoustic echo cancellation algorithm has been developed which uses both complex and real AIR estimates. The complex, single-sided filters are used to perform the subbanding, which eliminates the need for cross-filters.

Double-talk is detected within each subband, which tends to give better performance than fullband detection.

The invention permits arbitrary filtering blocks to be inserted between analysis and synthesis filter banks without suffering the effects of aliasing errors.

A further aspect of the invention provides a digital signal processing apparatus comprising a bank of complex-valued, single sided filters for separating an input signal into a plurality of subbands, and means for processing signals within said subbands.

The invention still further provides an echo cancellation apparatus comprising a first bank of complex-valued, single-sided subband filters to separate a remote signal into a plurality of subbands, adaptive filters generating an error estimate in each subband, a second filter bank of complex-valued, complex-valued, single-sided subband filters to separate a local signal into a plurality of subbands, a subtractor for subtracting the signal estimates from the local signal in each subband, and a third bank of single-sided subband filters to reconstitute the subbands into a composite output signal.

BRIEF DESCRIPTION OF THE DRAWINGS

The invention will now be described in more detail, by way of example, only with reference to the accompanying drawings, in which:-

DETAILED DESCRIPTION OF THE DRAWINGS

Figure 1:
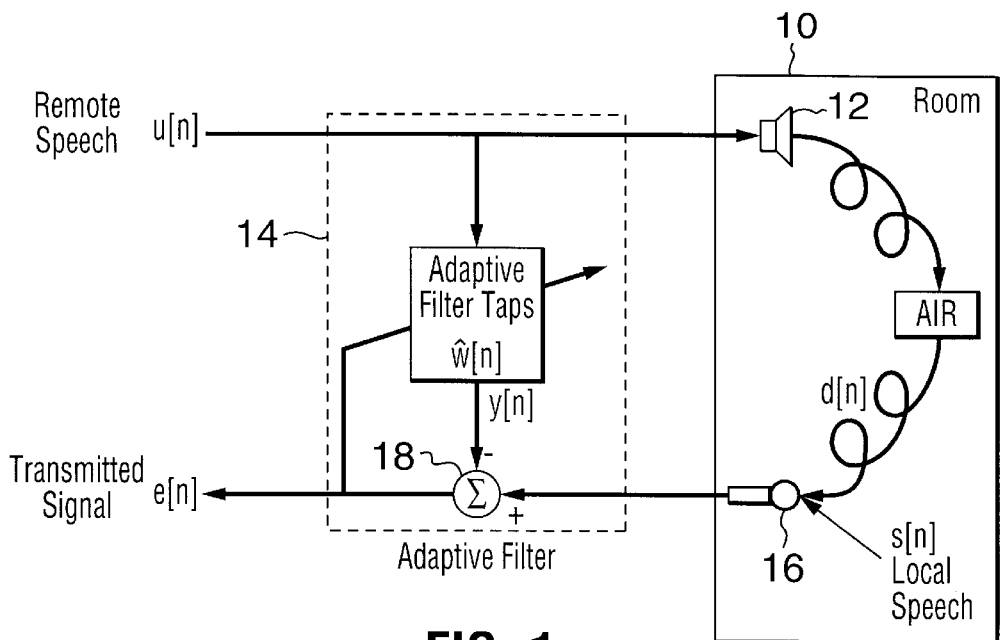
FIG. 1 illustrates a basic acoustic echo canceller using adaptive filtering in accordance with the prior art.

Referring now to the drawings, FIG. 1 shows an example of how echo problems arise in hands-free telephone and audio conferencing systems. Every room 10 has an acoustic impulse response (AIR) which imparts an echo to any sound source 12 in the room. An adaptive filter 14 generates an estimate, y[n], of the echo signal and subtracts it in subtractor 18 from the near-end signal picked up by microphone 16. The remote, or far-end, speech signal, u[n], forms one input to the adaptive filter 14. The subtraction of the echo estimate from the microphone input, d[n], gives the error signal which is sensed and used to modify the echo estimate. The adaptive filter tries to force e[n] to zero, so the filter is only active (i.e. adapting) when there is no local speech. A separate module is used to determine whether or not a local signal is present.

Figure 2:
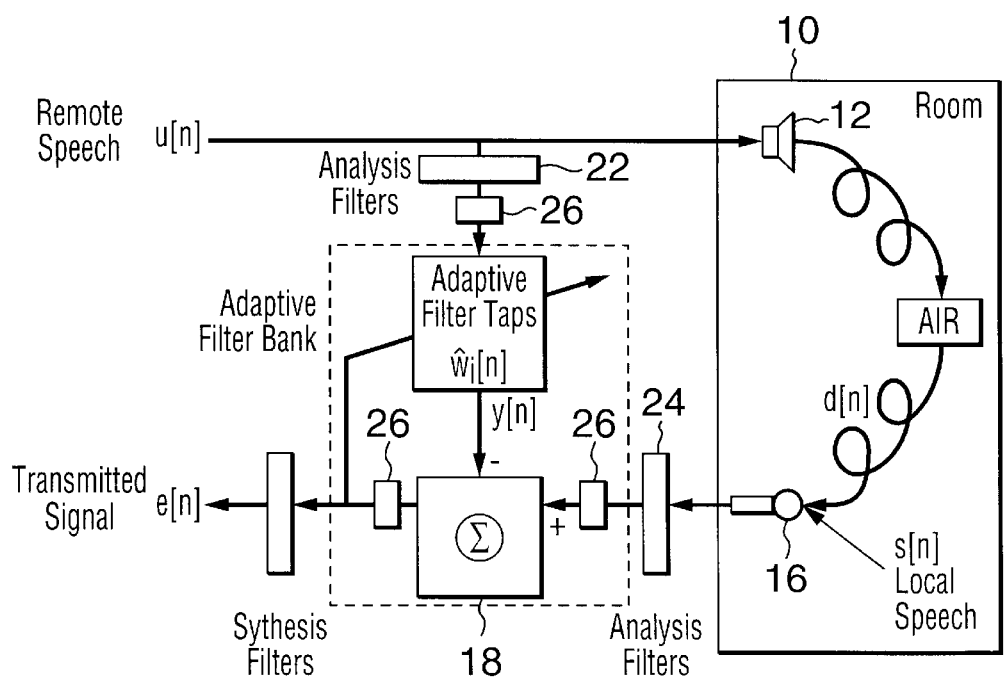
FIG. 2 illustrates a subbanded echo canceller.

FIG. 2 shows a subbanded approach to echo cancellation, where there is now a block of adaptive filters 14, one for each subband. The remote (far-end) speech signal has been separated into subbands in analysis filters 22 before entering the adaptive filters 14. The local signal is separated into subbands by analysis filters 24 before being passed to the subtractor 18. The cancellation of the echo is done within each subband. The results of the subtractions are the error signals which are fed back to the corresponding adaptive filters.

Figure 3:
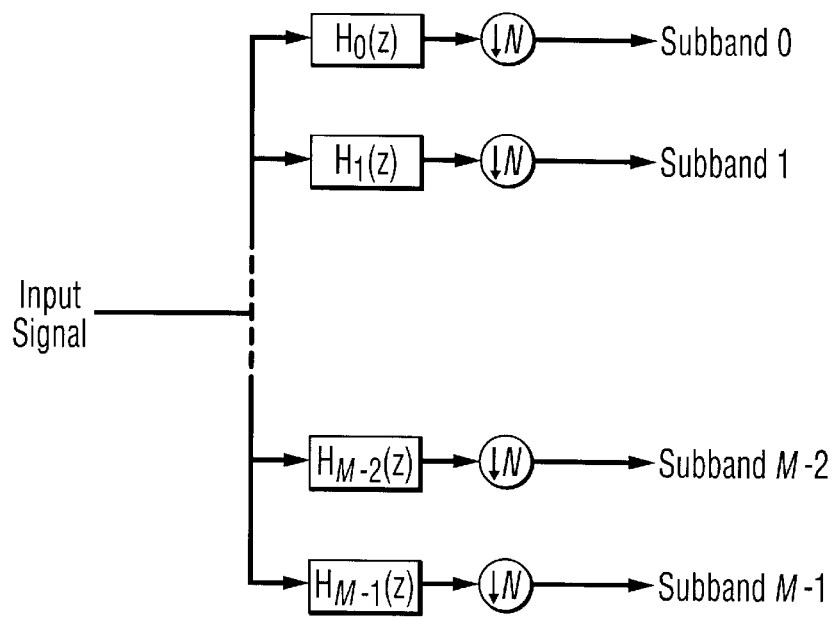
FIG. 3 shows an M-channel analysis filter bank.

As shown in FIG. 3, the analysis filters 14 split an incoming signal into subbands. This is accomplished by first filtering the signal to isolate each subband's frequency components, and then downsampling by a factor of N. The downsampling process keeps every Nth sample and discards the rest. Thus the bit rate is reduced by a factor of N. This is actually wasteful since much of the work done by the filters is being thrown away. In a preferred arrangement, polyphase decomposition is employed to move the downsamplers outside the filters. With a polyphase implementation, only the samples that are needed are generated. This reduces the number of computations required to perform the subbanding by a factor of N. Polyphase Decomposition is a method of factoring filter or signal coefficients by grouping every $M^{th}$ coefficient. For example, an M=2 polyphase decomposition will group even and odd components. Polyphase decomposition is used to efficiently perform downsampling and upsampling.

Figure 4A:
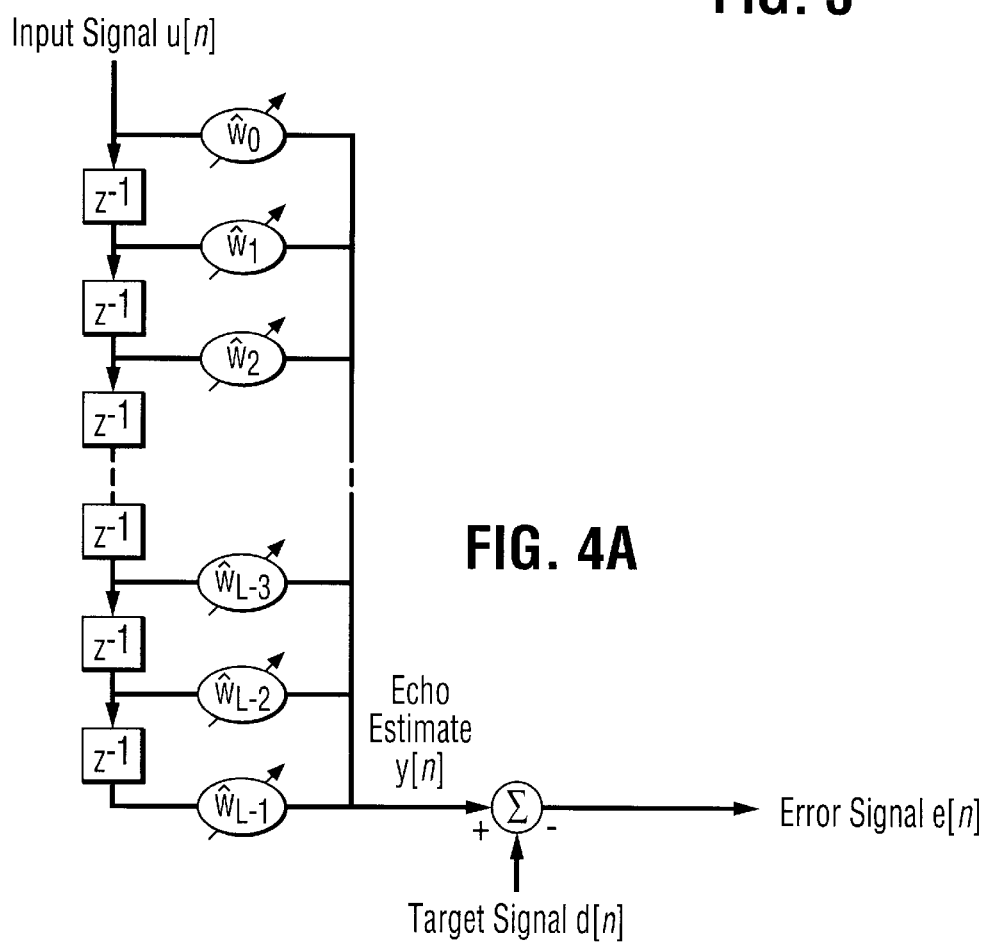
FIGS. 4a and 4b shows an adaptive filter structure.
Figure 4B:
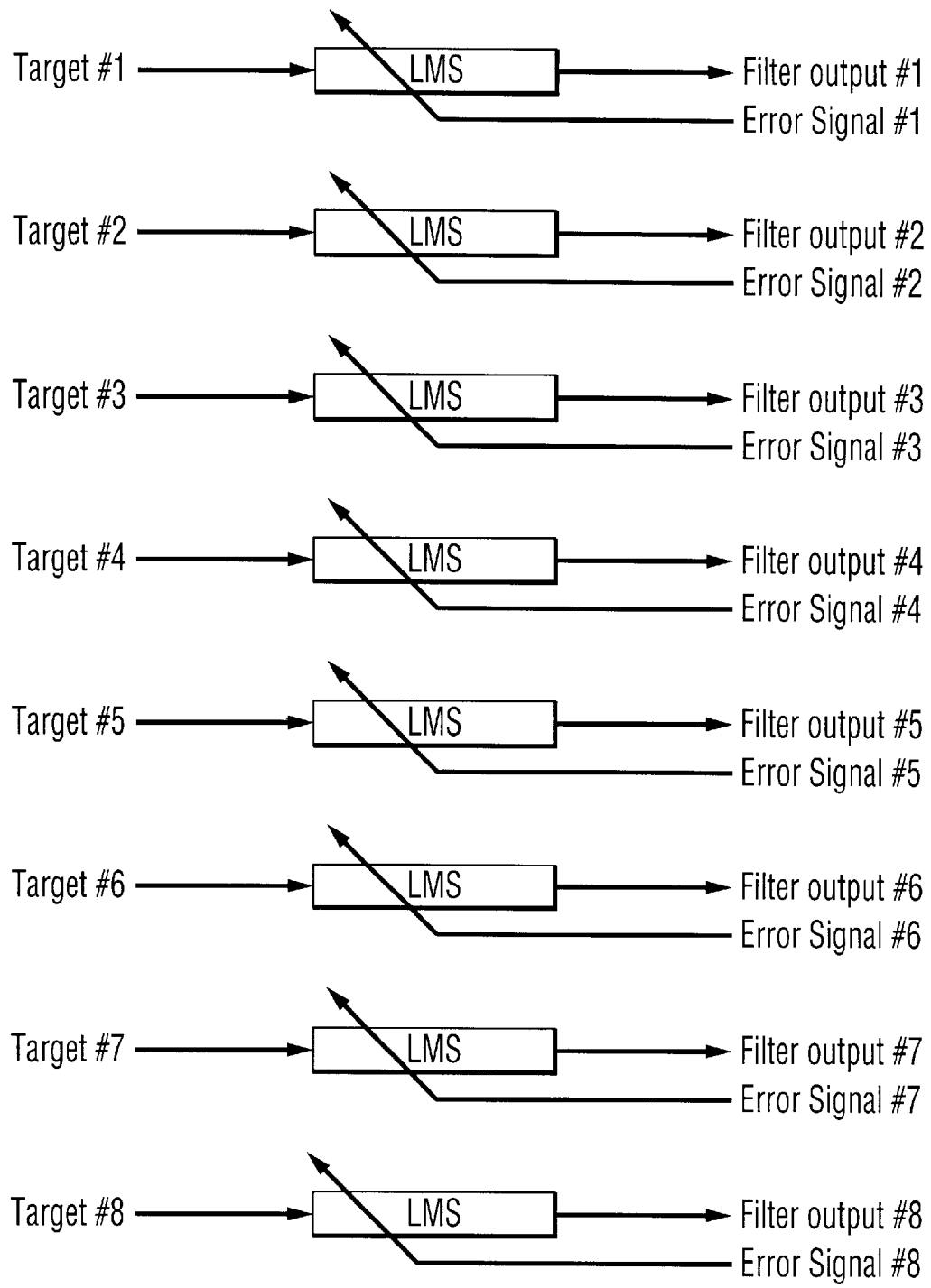

FIG. 4(a) shows an adaptive transversal filter with an unspecified adaptive tap weight control mechanism. The tap weight control mechanism can be any of the common methods. In this case the normalized LMS algorithm has been selected. Regardless of the method chosen, the error signal (the difference between the adaptive filter output and the target signal) is used to modify the tap weights. FIG. 4(b) shows the bank of adaptive filters used in the subband echo canceller.

Figure 5:
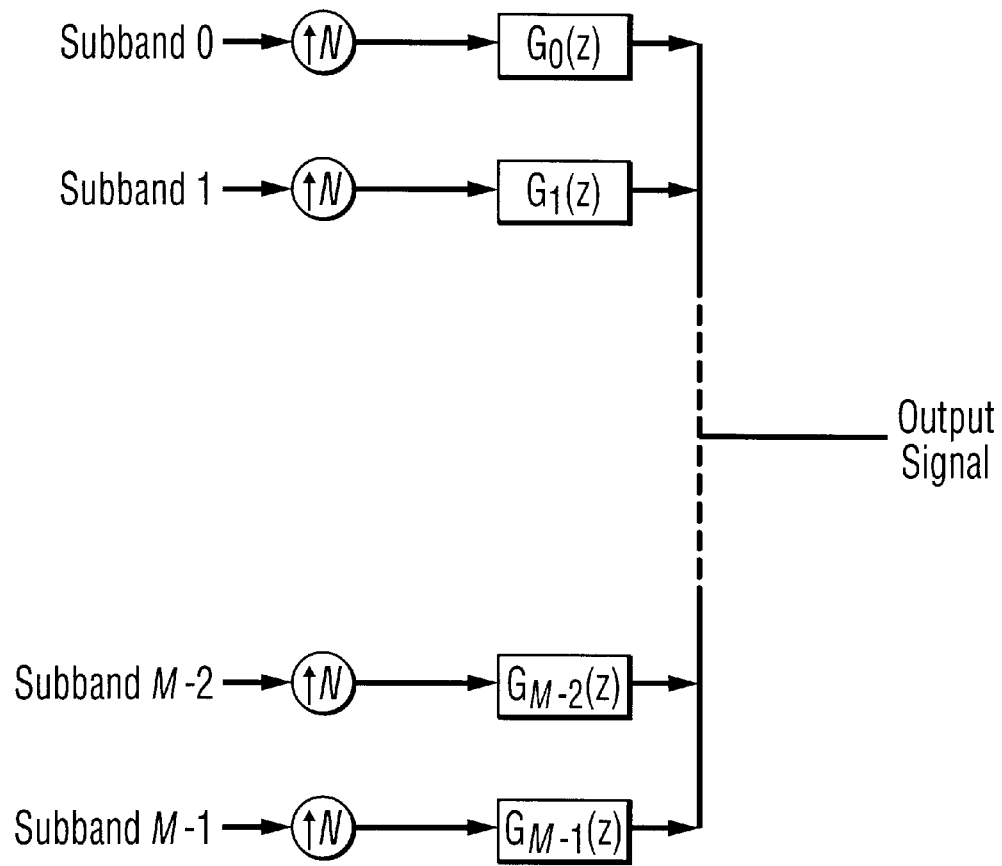
FIG. 5 shows an M-channel synthesis filter bank.

In FIG. 5, the subband signals are upsampled, filtered and merged back into a single output signal. Upsampling involves inserting N−1 zeroes between samples. The filters then interpolate between non-zero samples to smooth out the signal. Again, a polyphase implementation should be used to do this efficiently.

Figure 6A:
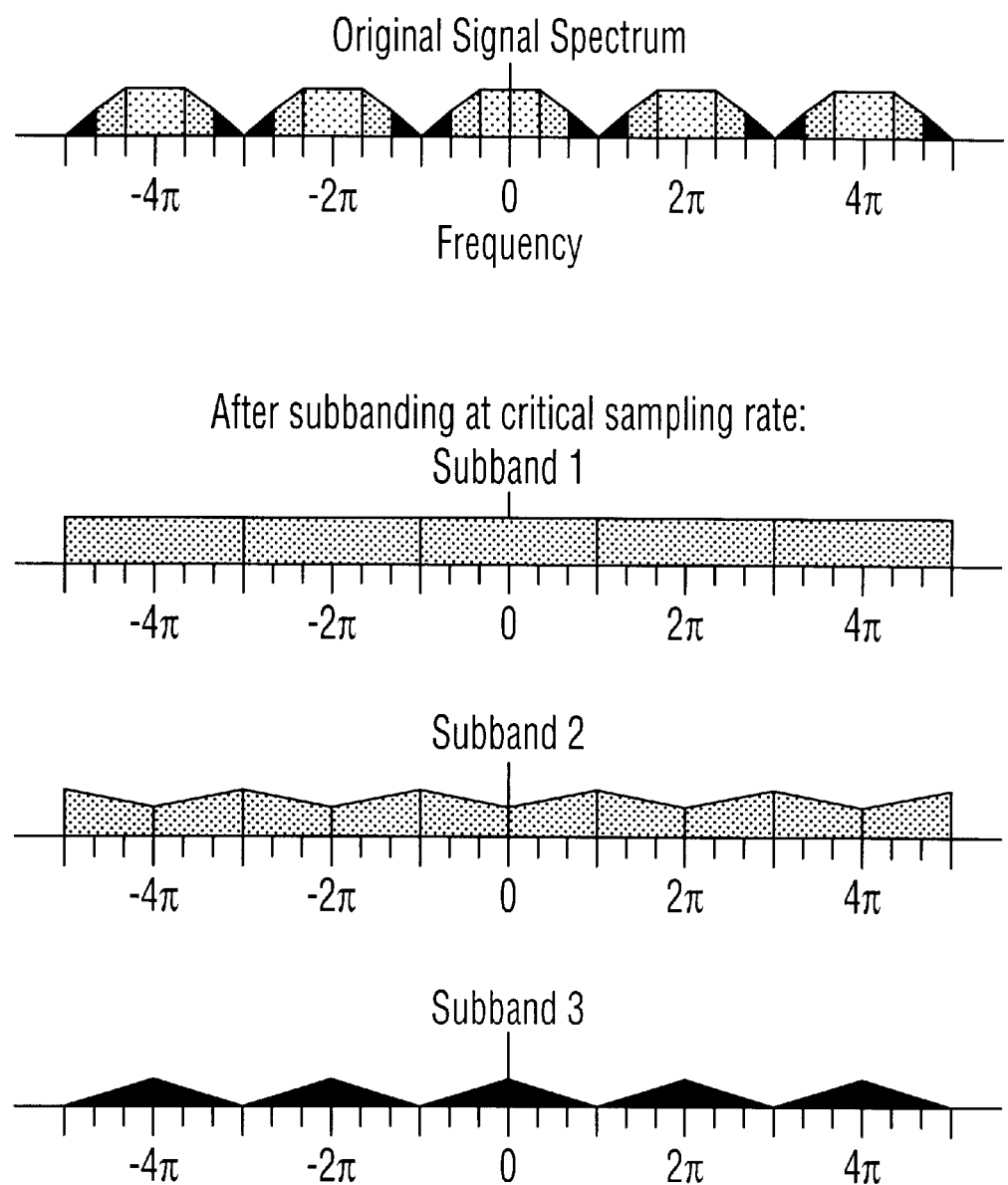
FIGS. 6a and 6b show aliasing with real and complex filter components.

A primary goal behind subbanding is to maximize the downsampling rate. This reduces the signal bit rate by as much as possible, and provides the algorithm more time to do its computations. With subband filters that use real-valued coefficients, the downsampling rate cannot exceed the number of subbands. This is critical sampling. If the downsampling rate is pushed beyond critical sampling there will always be aliasing, even with ideal subband filters. Aliasing occurs because the negative frequency components from one subband start to overlap with the positive frequency components from another subband. At critical sampling with ideal filters, aliased images within each subband are just touching as shown in FIG. 6(a). Since ideal filters cannot be built, aliasing will occur close to the critical sampling rate. With real filter coefficients the negative frequency components are always present, and critical sampling cannot be attained without aliasing.

Figure 6B:
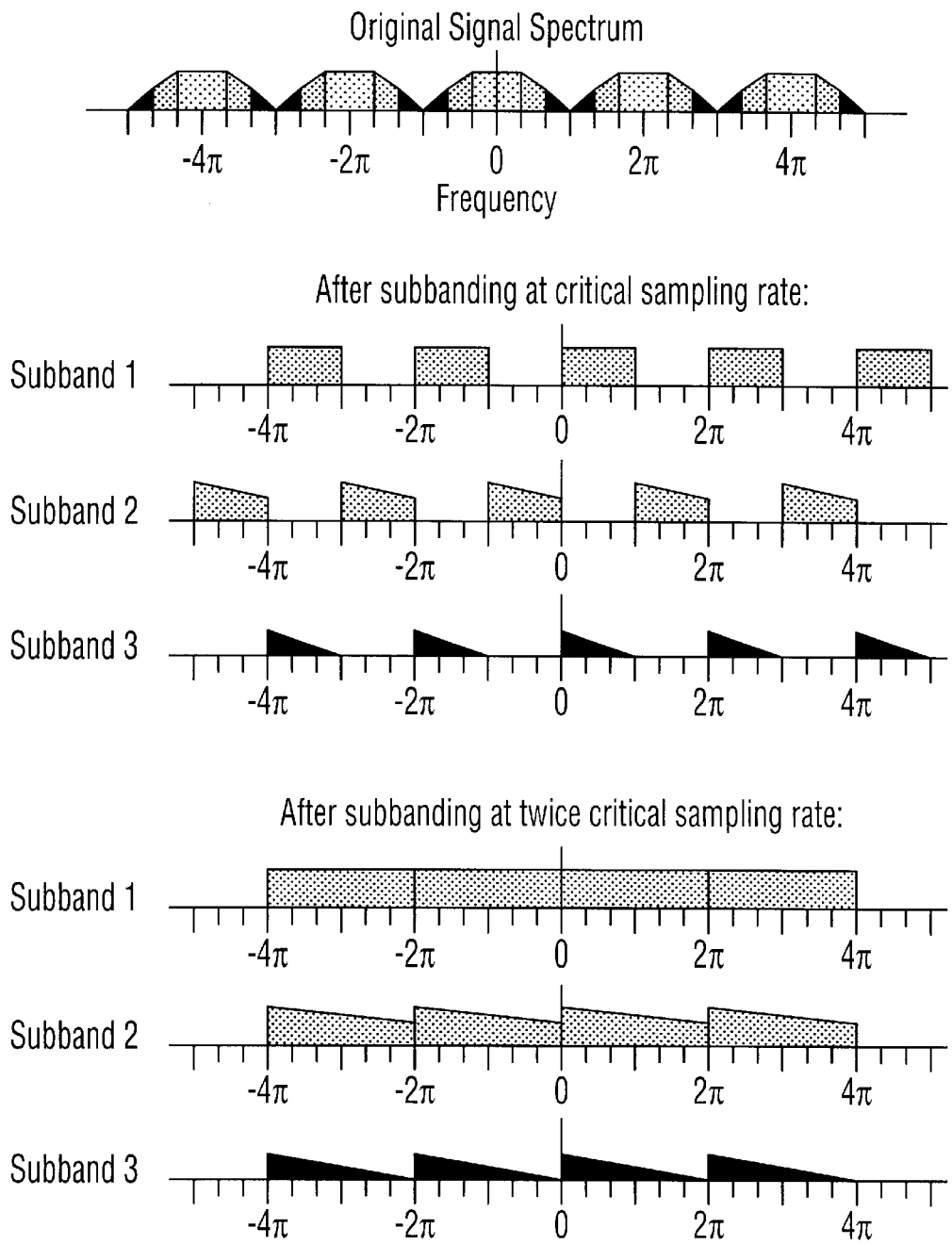

With complex-valued, single-sided filters, negative or positive frequency components are not retained. When single-sided filters are used in a filter bank, aliasing can be made negligible at critical sampling rates, even with non-ideal filters. In fact, as shown in FIG. 6(b), aliasing only becomes a problem at close to twice the critical sampling rate. Complex-valued, single-sided filters will therefore permit subbanding to occur at almost twice the downsampling rate (i.e. half the sampling rate) than is possible with real-valued filters.

A major downside to using single-sided filters is that implementing algorithms using complex arithmetic requires about four times as many computations as with real arithmetic. However, when single-sided filters are applied to the echo cancellation problem the benefits outweigh this computational cost. The adaptive filters now have even fewer taps to adjust, and this can lead to faster convergence and less error. By choosing a downsampling rate just under twice the critical sampling rate, aliasing will still be almost negligible, and cross-filters will not be needed. Some complex arithmetic can be done in parallel (for example, the real and imaginary parts of a complex product can be calculated simultaneously by parallel processors). This can be exploited in a hardware implementation, if the economic cost can be justified.

Since single-sided filters allow critical sampling to be exceeded, this can maximize the benefits of using subbanding to help solve signal processing problems. In the case of echo cancellation, the computational penalty for using complex arithmetic is made up for by the reduced bit rate and the lack of cross-fitters. Convergence times also increase, and better AIR estimates are generated. It is expected that similar increases in performance could occur if the single-sided filters were used in other problems. For example, blind deconvolution, channel equalization and signal separation all involve estimating unknown signals, much like echo cancellation.

In the current implementation, the subband filters are designed using frequency shifted versions of a prototype filter. The prototype filter is generated by a least-squares optimization method. A "near-ideal" filter is specified which has unity passband amplitude, zero stopband amplitude, and a narrow transition band. An optimal, least-squares approximation of this ideal filter is then generated. The optimal filter is then shifted to the appropriate frequency band by multiplication with a complex exponential. The passband, transition band and stopband boundaries vary depending on the number of subbands and the downsampling rate being used. Table 1 indicates the filter coefficients of the preferred embodiment.

Figure 7:
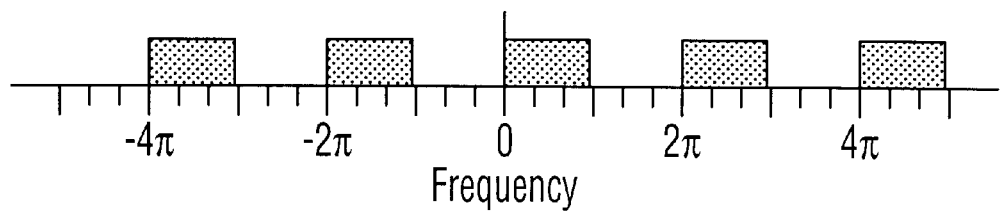
FIG. 7 shows the effect of real and complex AIR estimates.
Figure 7:
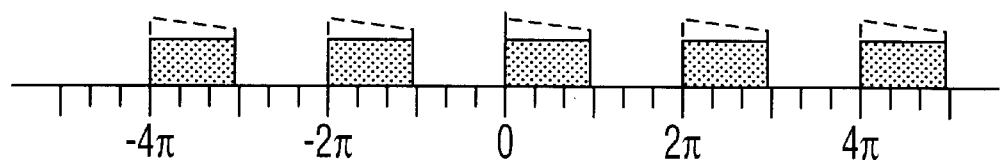
Figure 7:
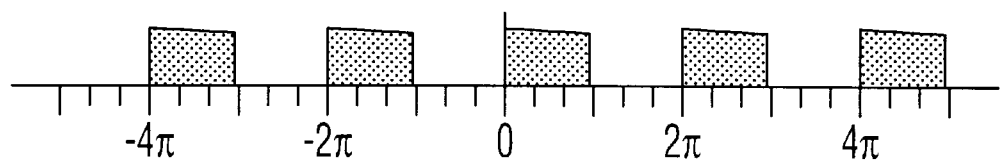
Figure 7:
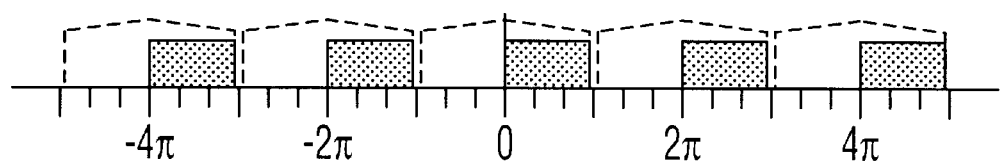
Figure 7:
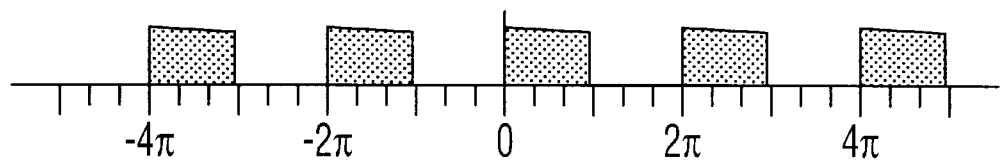

Single-sided subband filters allow the critical sampling rate to be exceeded when performing echo cancellation. Under such circumstances, all subbanded signals must remain complex and single-sided. Full complex arithmetic is required since the AIR estimates must be complex. Another option is to limit the downsampling rate to critical sampling or less, and use real AIR estimates. An echo signal is generated by time-domain convolution of a speech signal with the AIR of a room. This corresponds to the multiplication of the signa's frequency spectrum with the frequency spectrum of the AIR. Since the subbanded speech signal is single-sided, multiplication with a double-sided AIR estimate will still yield a single-sided echo signal. FIG. 7 demonstrates this. The benefits of using real AIR estimates are that multiplication of a real-valued signal with a complex-valued one requires half as many computations as full complex multiplication, and it is easier to implement. Unfortunately, the downsampling rate must also drop by a factor of two, so there is no overall computational gain.

Double-talk refers to the situation where both parties are speaking at the same time. To avoid divergence of the adaptive filters, the coefficients must be frozen during periods of double-talk. Double-talk is usually more noticeable in some subbands than in others. Because of this, a subbanded double-talk detector 26 is used within each subband. If it finds double-talk, even in just one subband, all the adaptive filters are frozen. Two detection methods are used. One method compares the amplitude of the far-end signal with the amplitude of the microphone signal. If an excessive increase in amplitude is noticed, double-talk is assumed. The other method monitors the level of cancellation. If the adaptive filters are known to have converged, yet there is little cancellation occurring, double-talk is suspected (such a condition could also correspond to an AIR change, hence the need for the first method as backup). The normalized LMS algorithm is also modified so that the value of $\mu$ is inversely proportional to the level of echo cancellation. As the level of cancellation increases, the value of t decreases. This allows a more accurate AIR estimate to be generated, and provides greater resistance to adaptive filter tap divergence because of double-talk.

Figure 8:
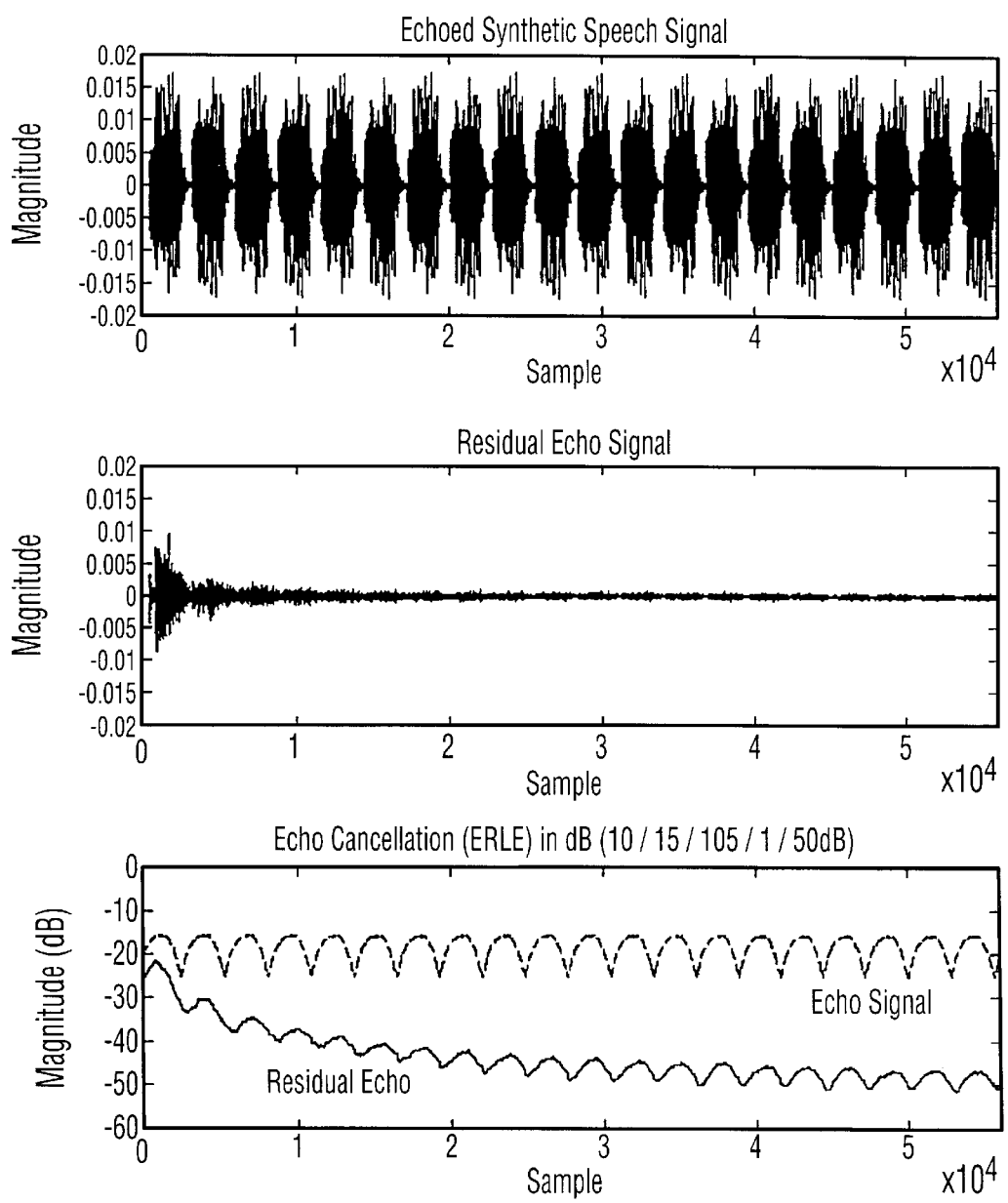
FIG. 8 shows the test results from an echo canceller using complex AIR estimates.

FIG. 8 shows test results from the preferred embodiment of an echo canceller using complex AIR estimates. The simulations were done using 10 subbands; with a downsampling rate of 15. The subband filters had 105 coefficients, and the synthesis filters were slightly wider than the analysis filters (this reduces distortion). The filter coefficients can be found in Table 1. The audio signal (shown on top) was a synthetic speech sample approximately 8 seconds long. A 2000 sample (¼ second) AIR from a real room was used to generate the echo. In addition, the local signal (i.e. the signal picked up by the microphone) was contaminated with Gaussian noise at a 50 dB, SNR. The middle plot shows the residual echo, and the bottom plot shows the level of echo cancellation (ERLE—Echo Return Loss Enhancement) based on blocks of 1000 samples. In this simulation, approximately −24 dB of cancellation was obtained after 2 seconds, and −29 dB after 4 seconds. Similar results were obtained using actual speech samples. Once the adaptive filter achieves a reasonable level of convergence, about −15 to −20 dB of cancellation can be maintained even in the presence of double-talk.

A digital signal processing (DSP) implementation of the above configuration would require approximately 8 MIPS. About 6.5 MIPS are needed for the echo cancellation algorithm, with an additional 1.5 MIPS to perform the subbanding.

Table 1 lists the filter coefficients for an analysis filter, h[n], and synthesis filter, g[n], for a 10 subband, 15× downsampling filter bank in accordance with one embodiment. Each filter has 105 coefficients. For each subband, the actual filters are just frequency shifted versions of the prototype filters. Frequency shifting is accomplished by multiplication by a complex exponential.

TABLE 1 h[n] = {0.0006, 0.0008, 0.0009, 0.0011, 0.0013, 0.0014, 0.0015, 0.0015, 0.0015, 0.0013, 0.0012, 0.0009, 0.0005, 0.0001, −0.0004, −0.0010, −0.0017, −0.0024, −0.0032, −0.0040, −0.0047, −0.0054, −0.0060, −0.0065, −0.0069, −0.0071, −0.0070, −0.0068, −0.0062, −0.0054, −0.0042, −0.0028, −0.0010, 0.0011, 0.0035, 0.0062, 0.0092, 0.0124, 0.0157, 0.0192, 0.0228, 0.0264, 0.0300, 0.0335, 0.0368, 0.0399, 0.0427, 0.0452, 0.0473, 0.0490, 0.0502, 0.0510, 0.0512, 0.0510, 0.0502, 0.0490, 0.0473, 0.0452, 0.0427, 0.0399, 0.0368, 0.0335, 0.0300, 0.0264, 0.0228, 0.0192, 0.0157, 0.0124, 0.0092, 0.0062, 0.0035, 0.0011, −0.0010, −0.0028, −0.0042, −0.0054, −0.0062, −0.0068, −0.0070, −0.0071, −0.0069, −0.0065, −0.0060, −0.0054, −0.0047, −0.0040, −0.0032, −0.0024, −0.0017, −0.0010, −0.0004, 0.0001, 0.0005, 0.0009, 0.0012, 0.0013, 0.0015, 0.0015, 0.0015, 0.0014, 0.0013, 0.0011, 0.0009, 0.0008, 0.0006} g[n] = {−0.0008, −0.0007, −0.0004, −0.0001, 0.0003, 0.0007, 0.0012, 0.0017, 0.0022, 0.0027, 0.0032, 0.0035, 0.0038, 0.0039, 0.0038, 0.0036, 0.0031, 0.0025, 0.0017, 0.0007, −0.0005, −0.0018, −0.0032, −0.0047, −0.0061, −0.0075, −0.0087, −0.0097, −0.0104, −0.0107, −0.0107, −0.0101, −0.0090, −0.0074, −0.0053, −0.0026, 0.0007, 0.0045, 0.0087, 0.0133, 0.0182, 0.0233, 0.0285, 0.0337, 0.0388, 0.0436, 0.0480, 0.0520, 0.0554, 0.0581, 0.0601, 0.0613, 0.0617, 0.0613, 0.0601, 0.0581, 0.0554, 0.0520, 0.0480, 0.0436, 0.0388, 0.0337, 0.0285, 0.0233, 0.0182, 0.0133, 0.0087, 0.0045, 0.0007, −0.0026, −0.0053, −0.0074, −0.0090, −0.0101, −0.0107, −0.0107, −0.0104, −0.0097, −0.0087, −0.0075, −0.0061, −0.0047, −0.0032, −0.0018, −0.0005, 0.0007, 0.0017, 0.0025, 0.0031, 0.0036, 0.0038, 0.0039, 0.0038, 0.0035, 0.0032, 0.0027, 0.0022, 0.0017, 0.0012, 0.0007, 0.0003, −0.0001, −0.0004, −0.0007, −0.0008}

The use of single-sided filter banks is not confined to subbanded echo cancellation. Filter banks are use in a wide variety of signal processing applications. Single-side filters could be used in other situations where subbanding has proved useful, for example, for blind deconvolution, blind signal separation, array signal processing, and a wide class of detection/estimation problems.

What is claimed is:

1. A method of processing an input signal, comprising:
    dividing said input signal into a plurality of subband signals with the aid of a bank of complex valued, single-sided subband filters;
    downsampling said subband signals by a factor that is greater than X, where N corresponds to the number of subbands, and
    processing said subband signals within said subbands with adaptive fitters.

2. A method as claimed in claim 1, wherein said subband filters have filter coefficients based on a least squares optimized approximation of a near ideal filter.

3. A method as claimed in claim 2, wherein doubletalk is detected within the individual subbands, and the coefficients of the adaptive filters are frozen during periods of double talk.

4. A method as claimed in claim 2, wherein the subband signals are downsampled by a factor less tan 2N, where N corresponds to the number of subband filters.

5. A method as claimed in claim 4, wherein said subband filters are implemented by polyphase decomposition.

6. A method as claimed in claim 1, wherein said signal is processed to perform echo cancellation based on the use of complex and real AIR (Acoustic Impulse Response) estimates.

7. Digital signal processing apparatus comprising:
    a bank of complex-valued, single sided filters for separating an input signal into a plurality of subband signals and downsampling said subband signals by a factor that is greater than N, where N corresponds to the number of subbands; and
    adaptive filters for processing signals within said subbands.

8. Digital signal processing apparatus as claimed in claim 7, wherein said subband filters have filter coefficients based on a least squares optimized approximation of a near ideal filter.

9. Digital signal processing apparatus as claimed in claim 7, further comprising a second bank of complex-valued, single sided filters to reconstitute an output signal from the plurality of subband signals.

10. Echo cancellation apparatus comprising
    a first bank of complex-valued, single-sided subband filters to separate a remote signal into a plurality of subband signals and downsample said subband signals by a factor that is greater than N, where N corresponds to the number of subbands;
    adaptive filters generating an error estimate in each subband;
    a second filter bank of complex-valued, complex-valued, single-sided subband filters to separate a local signal into a plurality of subband signals;
    a subtractor for subtracting the error estimates from the local signal in each said subband; and
    a third bank of single-sided subband filters to reconstitute the subbands into a composite output signal; and
    said subband filters of said first and second banks having filter coefficients based on a least squares optimized approximation of a near ideal filter.

11. Echo cancellation apparatus as claimed in claim 10, wherein said downsamnpling occurs by a factor great than N and less than 2N, where N corresponds to the number of subbands.

12. Echo cancellation apparatus as claimed in claim 11, further comprising a double talk detector within the subbands.

13. Echo cancellation apparatus as claimed in claim 12, wherein said double talk detector comprises a comparator for comparing the amplitude of the remote signal with the amplitude of the local signal within each band.

14. Echo cancellation apparatus as claimed in claim 12, wherein said double talk detector comprises means for monitoring the level of cancellation.

* * * * *